(12) United States Patent
Leduc et al.

(10) Patent No.: US 9,910,125 B2
(45) Date of Patent: Mar. 6, 2018

(54) METHODS, SYSTEMS, AND COMPUTER READABLE MEDIA FOR ADAPTIVELY CALIBRATING TEST SYSTEMS FOR DIFFERENT INTERCONNECTS

(71) Applicant: Ixia, Calabasas, CA (US)

(72) Inventors: Jason Marcel Leduc, California, CA (US); Clifford Tavares, Agoura Hills, CA (US); Avinash Ramanath, Valencia, CA (US); Anupkumar Mohanial Jethra, West Hills, CA (US); Rajanish Jain, Encino, CA (US); Lewis Ajax Johnson, Delta (CA)

(73) Assignee: KEYSIGHT TECHNOLOGIES SINGAPORE (HOLDINGS) PTE. LTD., Singapore (SG)

( * ) Notice: Subject to any disclaimer, the term of this patent is extended or adjusted under 35 U.S.C. 154(b) by 2 days.

(21) Appl. No.: 15/062,015

(22) Filed: Mar. 4, 2016

(65) Prior Publication Data
US 2017/0254870 A1 Sep. 7, 2017

(51) Int. Cl.
*G01R 35/00* (2006.01)
*G01R 31/00* (2006.01)

(52) U.S. Cl.
CPC ............ *G01R 35/005* (2013.01); *G01R 31/00* (2013.01)

(58) Field of Classification Search
None
See application file for complete search history.

(56) References Cited

U.S. PATENT DOCUMENTS

| | | | |
|---|---|---|---|
| 6,434,716 B1 | 8/2002 | Johnson et al. | |
| 7,688,749 B1 | 3/2010 | Lo | |
| 8,406,285 B1 * | 3/2013 | Diukman | H04L 25/03038 375/233 |
| 2003/0063664 A1 * | 4/2003 | Bodenschatz | H03H 21/0012 375/232 |
| 2009/0316727 A1 * | 12/2009 | Huang | H04L 7/0058 370/488 |
| 2013/0185466 A1 * | 7/2013 | Voorhees | G06F 13/4295 710/29 |

OTHER PUBLICATIONS

"Understanding Data Eye Diagram Methodolog for Analyzing High Speed Digital Signals," Semiconductor Compenents Industries, LLC, Publication Order No. AND9075/D p. 1-7 (Jun. 2015).

* cited by examiner

*Primary Examiner* — Clayton E Laballe
*Assistant Examiner* — Jas Sanghera (57) ABSTRACT

The subject matter described herein relates to methods, systems, and computer readable media for adaptive calibration of test systems to interconnects. In some examples, a control circuit performs a method for adaptive calibration including determining, for each configurable calibration parameter of a number of configurable calibration parameters for a receiver for processing a received signal from an interconnect coupled to the receiver, a range of valid values for the configurable calibration parameter. The method further includes for each configurable calibration parameter: sweeping the configurable calibration parameter across a subset of values from the range of valid values for the configurable calibration parameter; and testing the received signal from the interconnect for each value in the subset of values and storing a result of the testing for the value. The method further includes determining a set of calibrated values for the configurable calibration parameters based on the results of the testing.

19 Claims, 6 Drawing Sheets

METHODS, SYSTEMS, AND COMPUTER READABLE MEDIA FOR ADAPTIVELY CALIBRATING TEST SYSTEMS FOR DIFFERENT INTERCONNECTS

TECHNICAL FIELD

The subject matter described herein relates generally to communications test systems. More particularly, the subject matter described herein relates to methods, systems, and computer readable media for adaptive calibration of test systems for different interconnects.

BACKGROUND

Interconnects include cables, both electrical and optical, used to connect test systems to systems under test. Often, a test system is calibrated for a particular interconnect or family of interconnects. As a result, manual calibration can be required if the test system is used with interconnects other than those for which the test system is calibrated.

The quality of calibration of a test system to an interconnect can be measured using an eye diagram, which can be generated using an oscilloscope. An oscilloscope is a type of electronic test instrument that allows observation of constantly varying signal voltages. For example, an oscilloscope can present a two-dimensional plot of one or more signals as a function of time. Oscilloscopes can be used in communications test systems to display an eye diagram of a digital signal output from a receiver. The digital signal is repetitively sampled and applied to a vertical input of the oscilloscope and the data rate triggers the horizontal sweep, resulting in a superposition of many possible realizations of the signal viewed on top of each other. A user of a communications test system can use the eye diagram to evaluate the combined effects of noise and interference on the signal.

The user can also calibrate the receiver to a particular interconnect by adjusting the receiver and observing the effects of adjustments on the eye diagram. The user changes one parameter value, looks at the eye, then changes another parameter value, and so on. The user may have to test a hundred or more different configurations. Calibrating a receiver in this manner can result in an optimal setting but takes a long time and requires an oscilloscope and a certain amount of skill on the part of the user.

In light of these difficulties, there exists a need for methods, systems, and computer readable media for adaptive calibration of test systems for different interconnects.

SUMMARY

The subject matter described herein relates to methods, systems, and computer readable media for adaptive calibration of test systems to interconnects. In some examples, a control circuit performs a method for adaptive calibration including determining, for each configurable calibration parameter of a number of configurable calibration parameters for a receiver for processing a received signal from an interconnect coupled to the receiver, a range of valid values for the configurable calibration parameter. The method further includes for each configurable calibration parameter: sweeping the configurable calibration parameter across a subset of values from the range of valid values for the configurable calibration parameter; and testing the received signal from the interconnect for each value in the subset of values and storing a result of the testing for the value. The method further includes determining a set of calibrated values for the configurable calibration parameters based on the results of the testing.

The subject matter described herein can be implemented in software in combination with hardware and/or firmware. For example, the subject matter described herein can be implemented in software executed by a processor. In one exemplary implementation, the subject matter described herein can be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

DETAILED DESCRIPTION

Figure 1:
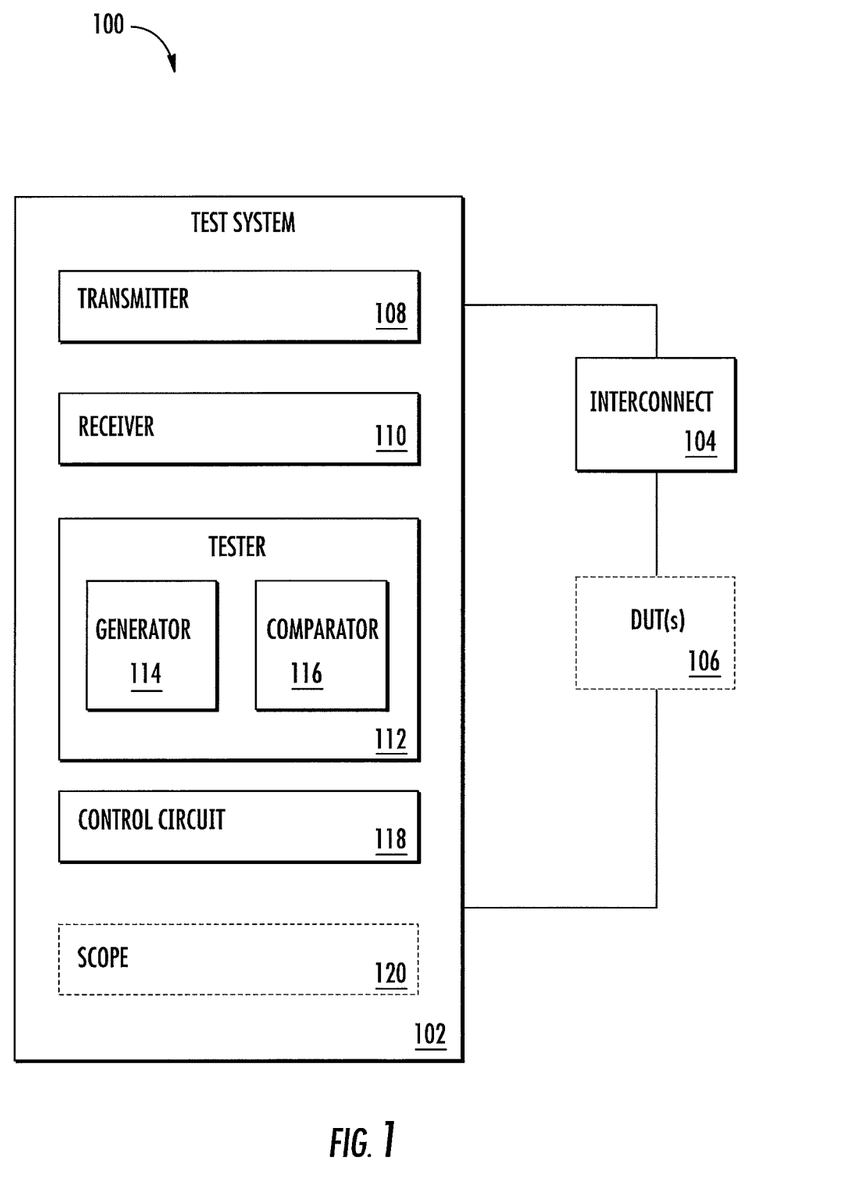
FIG. 1 is a block diagram of an example communications environment including a test system.

FIG. 1 is a block diagram of an example communications environment 100 including a test system 102 configured for communication over an interconnect 104 and one or more optional devices under test (DUTs) 106. Test system 102 may be a physical device that sends test traffic and/or signals to DUTs 106 and that monitors the response of DUTs 106.

Interconnect 104 can include any appropriate medium or device or both for carrying a communications signal. For example, interconnect 104 can be a fiber-optic cable, a copper wire cable, or a radio link including wireless transmitters and receivers or transceivers. Interconnect 104 can include elements such as patch panels, couplers, and taps. DUTs 106 can include any appropriate devices that it is desirable to test; for example, DUTs 106 can include routers, switches, servers, firewalls, network address translators (NATs), amplifiers, and repeaters.

Test system 102 includes a transmitter 108 for transmitting the communications signal to interconnect 104. Test system 102 also includes a receiver 110 for receiving a return signal from interconnect 104 or DUTs 106. Test system 102 is configured to analyze the return signal to characterize interconnect 104. Test system 102 can calibrate the transmitter 108 or the receiver 110 or both to compensate for noise and interference introduced by interconnect 104.

Test system 102 includes a tester 112 including a generator 114 and a comparator 116. Generator 114 is a device configured to generate a test signal. For example, generator 114 can generate a pseudo-random bit sequence. Comparator 116 is a device configured to compare the return signal to the test signal, e.g., to characterize noise and interference introduced by interconnect 104. For example, where the test signal is a digital signal, comparator 116 can perform a bit-by-bit comparison between the test signal and the return signal.

Test system 102 includes a control circuit 118. Control circuit 118 is configured to perform adaptive calibration of test system 102 to interconnect 104. Control circuit 118 can be implemented in any appropriate combination of hardware, software, and firmware. For example, control circuit 118 can be implemented as a system of one or more computers configured, by virtue of appropriate programming, to control transmitter 108, receiver 110, and tester 112.

In operation, control circuit 118 determines, for each configurable calibration parameter for transmitter 108 or receiver 110 or both, a range of valid values for the configurable calibration parameter. For each configurable calibration parameter, control circuit 118 sweeps the configurable calibration parameter across a subset of values for the range of valid values for the configurable calibration parameter. Control circuit 118 tests, using tester 112, the received signal from interconnect 104 for each value in the subset of values and stores a result of the testing for the value. Control circuit 118 determines a set of calibrated values for the configurable calibration parameters based on the results of the testing.

Test system 102 can include an optional oscilloscope 120. A user of test system 102 can use oscilloscope 120 to validate the set of calibrated values produced by control circuit 118, e.g., by looking at an eye diagram produced using the set of calibrated values. The user may also wish to further customize the set of calibrated values using oscilloscope 120. In some examples, test system 102 lacks oscilloscope 120, which can reduce technical requirements for test system 102, e.g., size, weight, and cost requirements for test system 102.

In some examples, test system 102 includes a display and a user input device. A user of test system 102 can connect interconnect 104 to test system 102 and then use the user input device to initiate adaptive calibration by control circuit 118 and use the display to observe status indicators and the determined set of calibrated values. In some examples, test system 102 is programmed to perform various other test functions, and the user can use the display and the user input device to configure and perform the other test functions in addition to the adaptive calibration function.

Figure 2:
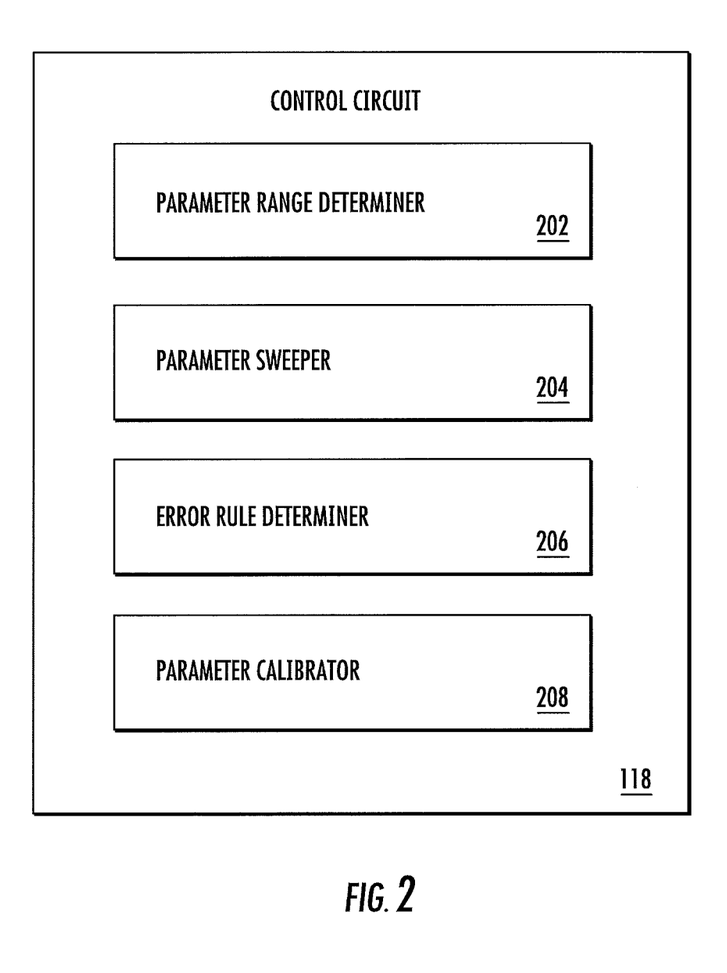
FIG. 2 is a block diagram of an example control circuit for adaptive calibration of the test system.

FIG. 2 is a block diagram of an example control circuit 118 for adaptive calibration of the test system. Control circuit 118 includes various modules including a parameter range determiner 202, a parameter sweeper 204, an error rate determiner 206, and a parameter calibrator 208. The modules can be implemented in any appropriate combination of hardware, firmware, and software.

Parameter range determiner 202 is configured to determine, for each configurable calibration parameter for a receiver or transmitter or both, a range of valid values for the configurable calibration parameter. For example, suppose that the receiver includes an equalizer. The configurable calibration parameters can be equalization parameters of the equalizer. If the equalizer includes a multi-tap filter, then at least some of the configurable calibration parameters can be weighting values for the taps of the multi-tap filter. Determining the valid ranges can include, e.g., reading the valid ranges from memory on the receiver, prompting a user to enter the valid ranges using a display and a user input device, or downloading the valid ranges from a server over a data communications network.

Parameter sweeper 204 is configured to sweep the configurable calibration parameters for testing. For each configurable calibration parameter, parameter sweeper 204 sweeps the configurable calibration parameter across a subset of values from the range of valid values for the configurable calibration parameter. For example, parameter sweeper 204 can select a configurable calibration parameter, fix the values of the other unselected configurable calibration parameters, and sweep the selected configurable calibration parameter across the subset of values while holding constant the fixed values of the other unselected configurable calibration parameters. Parameter sweeper 204 can change the value of a configurable calibration parameter, for example, by outputting a control signal or writing a value to an appropriate register or other location in memory of a transmitter or receiver.

Error rate determiner 206 is configured to test the received signal from the interconnect for each value in the subset of values, determines an error rate for the value, and stores the error rate as a result of the testing for the value. For example, error rate determiner 206 can use the tester 112 of FIG. 1 to perform the testing. Testing the received signal can include supplying, by a transmitter, a known signal to the interconnect and determining an error rate by comparing a processed receive signal from the receiver to the known signal. For example, error rate determiner 206 can determine a bit error rate using a pseudo-random bit sequence by dividing the number of bits resolved in error by the total number of bits in the pseudo-random bit sequence.

In some examples, parameter sweeper 204 sweeps the configurable calibration parameter across the subset of values by sweeping the configurable calibration parameter through selected values from the range of valid values for the configurable calibration parameter until an end condition is reached based on the results of the testing. For example, the end condition can be reached when an error rate resulting from the testing is below a threshold error rate, e.g., when the error rate drops to zero for pseudo-random bit sequence of sufficient length.

In some examples, parameter sweeper 204 initializes the configurable calibration parameter to a first value and then increases the configurable calibration parameter until an end condition is reached based on the results of the testing. Then, parameter sweeper 204 initializes the configurable calibration parameter to a second value greater than the first value and decreases the configurable calibration parameter until the end condition is reached. In this manner, parameter sweeper 204 probes the range of values inwards from a low value and a high value in search of a middle range of values that produce testing results deemed acceptable.

In general, parameter sweeper 204 sweeps the configurable calibration parameters through a subset of values from the range of valid values and not the entire range of valid values. For example, parameter sweeper 204 can step through values by incrementing or decrementing at fixed or random intervals or using a binary search algorithm or any appropriate algorithm for sampling the range of valid values. By avoiding the entire range of valid values, parameter sweeper 204 can identify ranges of values that produce acceptable testing results in less time than a complete brute force search would require. The resulting reduction in time means that control circuit 118 can be used to calibrate test systems to interconnects without requiring a system engineer to characterize those interconnects before installation.

Parameter calibrator 208 is configured to determine a set of calibrated values for the configurable calibration parameters based on the results of the testing. For example, parameter calibrator 208 can determine a centroid of a multi-dimensional array formed by the results of the testing. Such a multi-dimensional array is formed by viewing each configurable calibration parameter as a dimension and the test results from sweeping that configurable calibration parameter as data points along that dimension.

Since the testing reveals middle ranges of values presumed to produce acceptable testing results, determining the centroid of the multi-dimensional array will ordinarily result in the set of calibration values being close to an optimal set of calibration values or at least a set of calibration values that produce testing results deemed acceptable.

Figure 3:
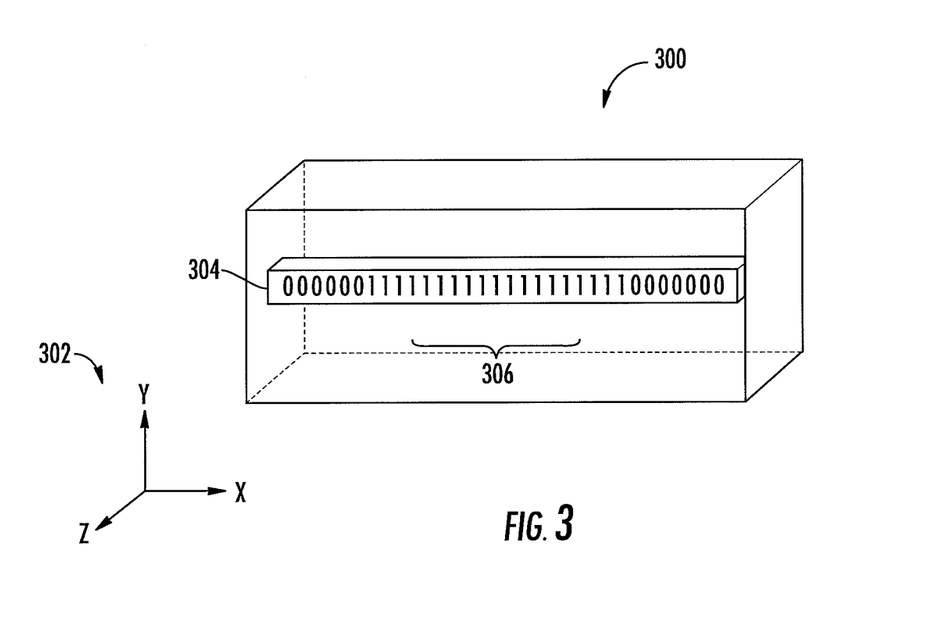
FIG. 3 is a diagram illustrating an example multi-dimensional array of test results as an object.

FIG. 3 is a diagram illustrating an example multi-dimensional array of test results as an object 300. For purposes of illustration, suppose that the test system 102 of FIG. 1 is calibrating three configurable calibration parameters of the receiver 110 of FIG. 1. In one example, the three configurable calibration parameters can be, e.g., pre, post, and main tap values of an equalizer used in receiver 110.

The three configurable calibration parameters can be visualized as a three-dimensional set of axis 302. The result of sweeping one configurable calibration parameter, on the x-axis, while holding the other two configurable calibration parameters constant, on the y and z axes, results in a row 304 of test results. Row 304 includes a middle range 306 of results where the results were deemed acceptable, i.e., where the error rate of testing at those configurable calibration parameters was below the threshold. Not all of the values in middle range 306 need to have been actually tested—test system 102 may have stopped sweeping the configurable calibration test parameter as soon as acceptable results were achieved in going from left to right and then right to left (or in the reverse order).

Although only one row is illustrated, the result of collectively sweeping through the three configurable calibration parameters would fill object 300 with rows of results. Determining the centroid of the multi-dimensional array is then accomplished by considering the locations in space with positive results as having mass and the locations in space without positive results as not having mass. Any appropriate algorithm can be used to determine the centroid. The values of the configurable calibration parameters at the centroid can be selected as the calibrated set of configurable calibration parameters.

Figure 4A:
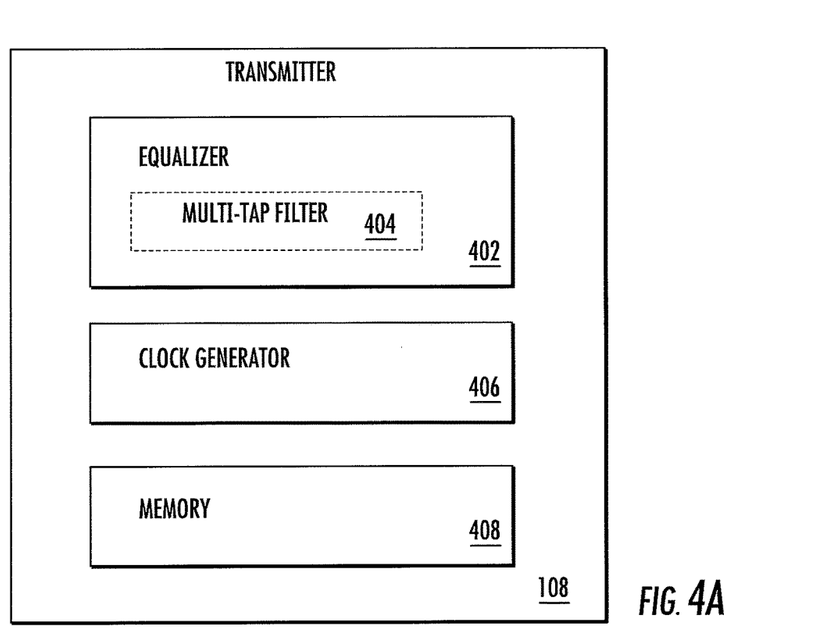
FIG. 4A is a block diagram of an example transmitter.

FIG. 4A is a block diagram of an example transmitter 108. Transmitter 108 includes an equalizer 402, a clock generator 406, and memory 408. Equalizer 402 can be configured, for example, to pre-distort transmitted pulses in order to invert channel distortion, e.g., at the cost of attenuated transmit signal. Equalizer 402 can include a multi-tap filter 404, e.g., a finite impulse response (FIR) filter. Each tap has a respective weight, and the weights of the taps can be calibrated by the control circuit 118 of FIG. 1.

Clock generator 406 is configured to generate a clock signal for use by transmitter 108. Clock generator 406 may also have configurable calibration parameters that can be calibrated by the control circuit 118 of FIG. 1. Memory 408 can store valid ranges of the configurable calibration parameters for equalizer 402 or clock generator 406 or both. In some examples, control circuit 118 reads memory 408 to determine valid ranges of the configurable calibration parameters.

Figure 4B:
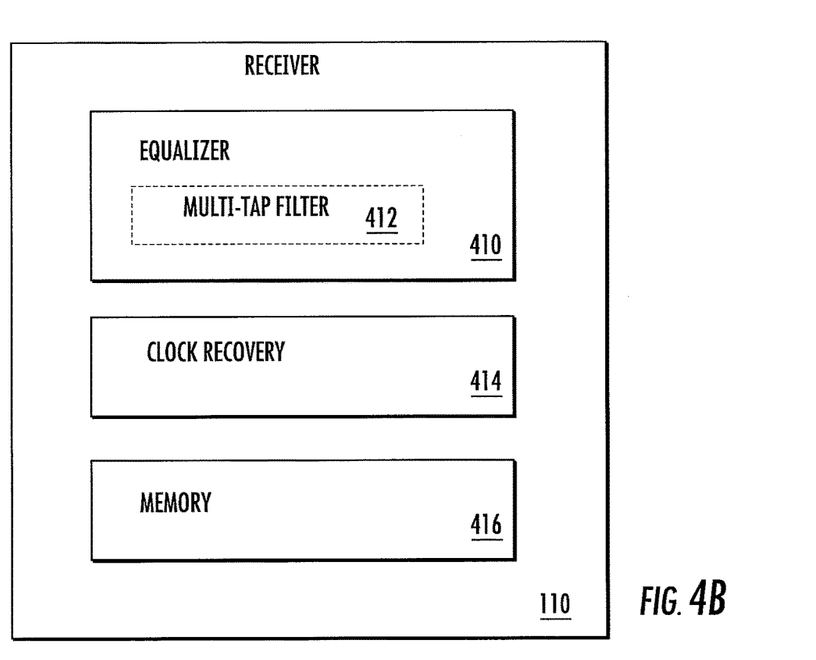
FIG. 4B is a block diagram of an example receiver.

FIG. 4B is a block diagram of an example receiver 110. Receiver 110 includes an equalizer 410, a clock recovery circuit 414, and memory 416. Equalizer 410 can be, for example, a decision feedback equalizer. Equalizer 410 can include a multi-tap filter 412, e.g., a finite impulse response (FIR) filter. Each tap has a respective weight, and the weights of the taps can be calibrated by the control circuit 118 of FIG. 1.

Clock recovery circuit 414 is configured to recover a clock signal from a received signal. Clock recovery circuit 414 may also have configurable calibration parameters that can be calibrated by the control circuit 118 of FIG. 1. Memory 416 can store valid ranges of the configurable calibration parameters for equalizer 410 or clock recovery circuit 414 or both. In some examples, control circuit 118 reads memory 416 to determine valid ranges of the configurable calibration parameters.

Figure 4C:
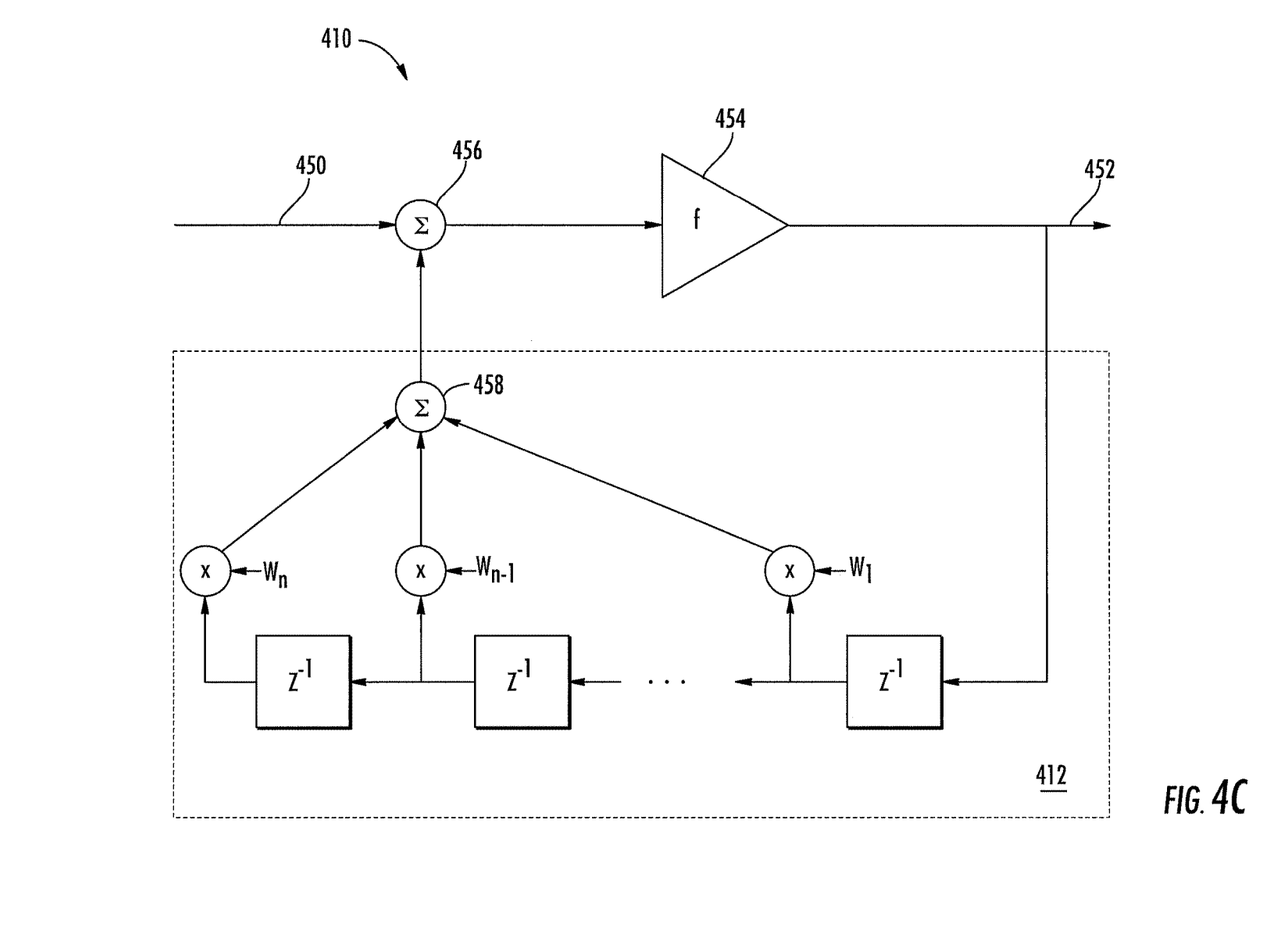
FIG. 4C is a block diagram of an example equalizer.

FIG. 4C is a block diagram of an example equalizer 410. In the illustrated example, equalizer 410 is a non-linear decision feedback equalizer. Equalizer 410 receives an incoming signal 450 and sums incoming signal 450 with a feedback signal at a feedback summer 456. A slicer 454 makes a symbol decision based on the output of feedback summer 456, i.e., slicer 454 quantizes its input, resulting in an output signal 452. Output signal 452 is fed into multi-tap filter 412, which includes a number of delay elements. Each delayed output is multiplied by a weight and summed at a filter summer 458 coupled to feedback summer 456. In operation, filter summer 458 subtracts inter-symbol interference from incoming signal 450 using multi-tap filter 412 to result in a cleaner output signal 452.

Figure 5:
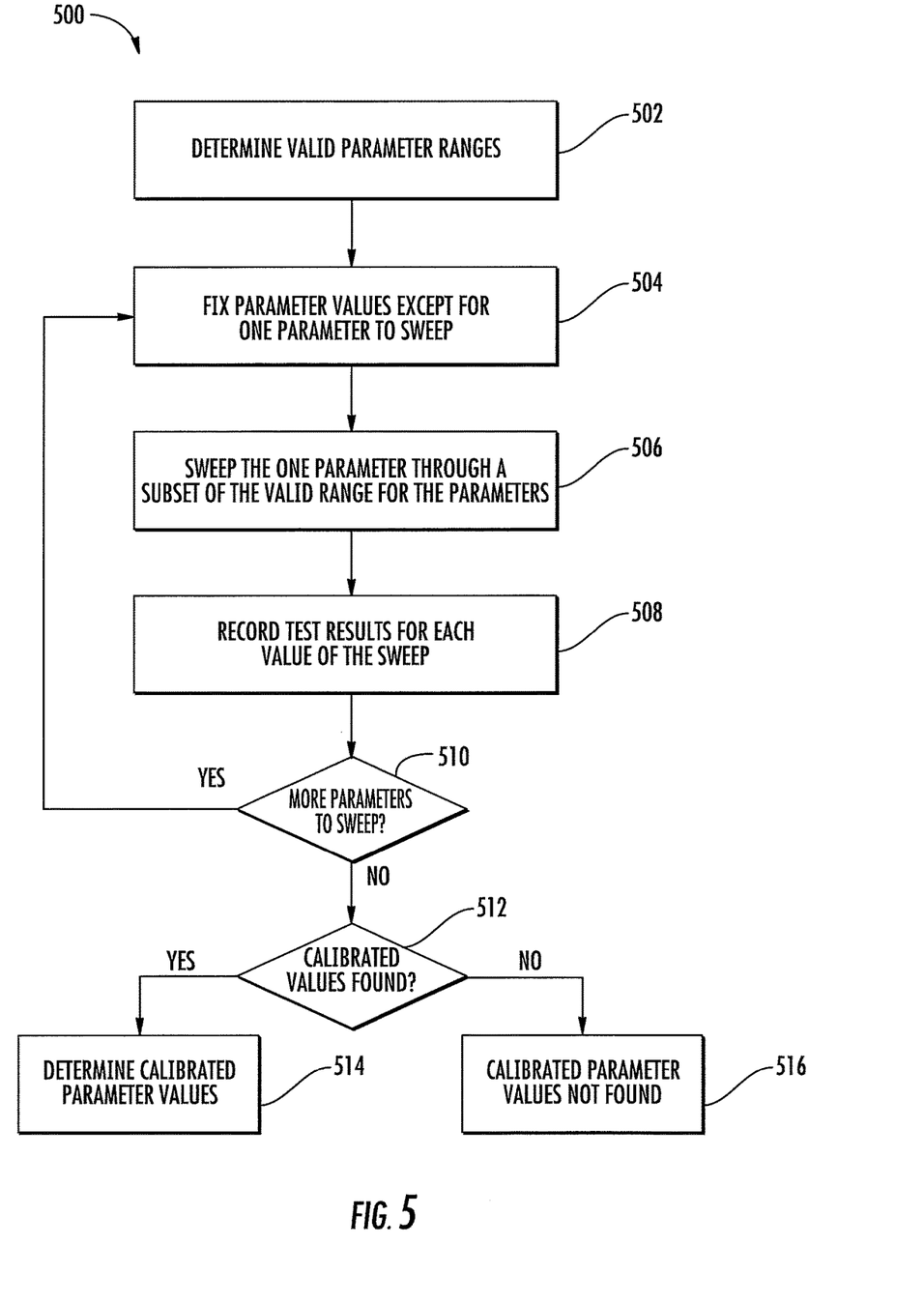
FIG. 5 is a flow diagram of an example method for adaptive calibration of a test system.

FIG. 5 is a flow diagram of an example method 500 for adaptive calibration of a test system. Method 500 can be performed by a control circuit, e.g., the control circuit 118 of FIG. 1, and for purposes of illustration, method 500 will be described with respect to a control circuit that performs method 500. The control circuit can be a system of one or more computers configured to perform method 500 by virtue of appropriate programming.

The control circuit determines, for each configurable calibration parameter of a number of configurable calibration parameters for a receiver for processing a received signal from an interconnect coupled to the receiver, a range of valid values for the configurable calibration parameter (502). For example, the receiver can include an equalizer, and the configurable calibration parameters can be equalization parameters. In some examples, the equalizer includes a multi-tap filter and the configurable calibration parameters are weighting values for the taps of the multi-tap filter. As another example, the configurable calibration parameters can specify an amplitude/gain in the system.

The control circuit fixes parameter values for all of the configurable calibration parameters except for one configurable calibration parameter to sweep (504). The control circuit sweeps the one configurable calibration parameter across a subset of values from the range of valid values for that configurable calibration parameter (506).

Sweeping the configurable calibration parameter can include holding each of the other configurable calibration parameters constant at the fixed values while sweeping the configurable calibration parameter. For example, sweeping the configurable calibration parameter across the subset of values can include sweeping the configurable calibration parameter through selected values from the range of valid values for the configurable calibration parameter until an end condition is reached based on the results of the testing. The end condition can be reached, e.g., when an error rate resulting from the testing is below a threshold error rate.

In some examples, sweeping the configurable calibration parameter across the subset of values includes initializing the configurable calibration parameter to a first value and then increasing the configurable calibration parameter until an end condition is reached based on the results of the testing. Then, the control circuit initializes the configurable calibration parameter to a second value greater than the first value and decreases the configurable calibration parameter until the end condition is reached.

The control circuit tests the received signal from the interconnect for each value while sweeping the configurable calibration parameter across the subset of values from the range of valid values for that configurable calibration parameter and stores a result of the testing for the value (508). Testing the received signal from the interconnect can include supplying, by a transmitter, a known signal to the interconnect and determining an error rate by comparing a processed receive signal from the receiver to the known signal. For example, the known signal can be a pseudo-random bit sequence, and determining the error rate can include determining a bit error rate using the pseudo-random bit sequence.

The control circuit determines whether there are more parameters to sweep (510). If so, the control circuit returns to fix parameter values (504), sweep another parameter (506), and record the results of testing during the sweep (508). If not, then the control circuit determines whether a valid set of calibrated values was found (512), e.g., whether the error rate ever dropped below or above the threshold error rate during sweeping. If yes, then the control circuit determines a set of calibrated values for the configurable calibration parameters based on the results of the testing (514). For example, determining the set of calibrated values for the configurable calibration parameters based on the results of the testing can include determining a centroid of a multi-dimensional array formed by the results of the testing. If not, then the control circuit provides an indication that calibrated parameter values were not found (516), e.g., the control circuit causes a message to be displayed on a display screen or turns on an error light.

Accordingly, while the methods, systems, and computer readable media have been described herein in reference to specific embodiments, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

It is understood that various details of the presently disclosed subject matter may be changed without departing from the scope of the presently disclosed subject matter. Furthermore, the foregoing description is for the purpose of illustration only, and not for the purpose of limitation.

What is claimed is:

1. A system comprising:
 a receiver for processing a received signal from an interconnect, wherein the receiver is configured to process the signal using a plurality of configurable calibration parameters each having a range of valid values; and
 a control circuit configured to calibrate the configurable calibration parameters to the interconnect by performing operations comprising:
  for each configurable calibration parameter:
   sweeping the configurable calibration parameter across a subset of values from the range of valid values for the configurable calibration parameter, wherein sweeping the configurable calibration parameter comprises holding each of the configurable calibration parameters, other than the configurable calibration parameter, constant while sweeping the configurable calibration parameter; and
   testing the received signal from the interconnect for each value in the subset of values and storing a result of the testing for the value; and
  determining a set of calibrated values for the configurable calibration parameters based on the results of the testing.

2. The system of claim 1, comprising a transmitter, wherein testing the received signal from the interconnect comprises supplying, by the transmitter, a known signal to the interconnect and determining an error rate by comparing a processed receive signal from the receiver to the known signal.

3. The system of claim 2, wherein supplying the known signal comprises supplying a pseudo-random bit sequence and wherein determining the error rate comprises determining a bit error rate using the pseudo-random bit sequence.

4. The system of claim 1, wherein sweeping the configurable calibration parameter across the subset of values comprises sweeping the configurable calibration parameter through selected values from the range of valid values for the configurable calibration parameter until an end condition is reached based on the results of the testing.

5. The system of claim 4, wherein the end condition is reached when an error rate resulting from the testing is below or above a threshold error rate.

6. The system of claim 1, wherein the receiver comprises an equalizer and wherein at least some of the configurable calibration parameters comprise equalization parameters.

7. The system of claim 6, wherein the equalizer comprises a multi-tap filter and the at least some of the configurable calibration parameters comprise weighting values for the taps of the multi-tap filter.

8. A system comprising:
 a receiver for processing a received signal from an interconnect, wherein the receiver is configured to process the signal using a plurality of configurable calibration parameters each having a range of valid values; and
 a control circuit configured to calibrate the configurable calibration parameters to the interconnect by performing operations comprising:
  for each configurable calibration parameter:
   sweeping the configurable calibration parameter across a subset of values from the range of valid values for the configurable calibration parameter; and
   testing the received signal from the interconnect for each value in the subset of values and storing a result of the testing for the value; and determining a set of calibrated values for the configurable calibration parameters based on the results of the testing;

wherein sweeping the configurable calibration parameter across the subset of values comprises:
  initializing the configurable calibration parameter to a first value and then increasing the configurable calibration parameter until an end condition is reached based on the results of the testing; and
  initializing the configurable calibration parameter to a second value greater than the first value and then decreasing the configurable calibration parameter until the end condition is reached.

9. A system comprising:
a receiver for processing a received signal from an interconnect, wherein the receiver is configured to process the signal using a plurality of configurable calibration parameters each having a range of valid values; and
a control circuit configured to calibrate the configurable calibration parameters to the interconnect by performing operations comprising:
  for each configurable calibration parameter:
    sweeping the configurable calibration parameter across a subset of values from the range of valid values for the configurable calibration parameter; and
    testing the received signal from the interconnect for each value in the subset of values and storing a result of the testing for the value; and
    determining a set of calibrated values for the configurable calibration parameters based on the results of the testing;
wherein determining the set of calibrated values for the configurable calibration parameters based on the results of the testing comprises determining a centroid of a multi-dimensional array formed by the results of the testing.

10. A method comprising:
determining, by a control circuit, for each configurable calibration parameter of a plurality of configurable calibration parameters for a receiver for processing a received signal from an interconnect coupled to the receiver, a range of valid values for the configurable calibration parameter;
for each configurable calibration parameter:
  sweeping the configurable calibration parameter across a subset of values from the range of valid values for the configurable calibration parameter, wherein sweeping the configurable calibration parameter comprises holding each of the configurable calibration parameters, other than the configurable calibration parameter, constant while sweeping the configurable calibration parameter; and
  testing the received signal from the interconnect for each value in the subset of values and storing a result of the testing for the value; and
determining a set of calibrated values for the configurable calibration parameters based on the results of the testing.

11. The method of claim 10, wherein testing the received signal from the interconnect comprises supplying, by a transmitter, a known signal to the interconnect and determining an error rate by comparing a processed receive signal from the receiver to the known signal.

12. The method of claim 11, wherein supplying the known signal comprises supplying a pseudo-random bit sequence and wherein determining the error rate comprises determining a bit error rate using the pseudo-random bit sequence.

13. The method of claim 10, wherein sweeping the configurable calibration parameter across the subset of values comprises sweeping the configurable calibration parameter through selected values from the range of valid values for the configurable calibration parameter until an end condition is reached based on the results of the testing.

14. The method of claim 13, wherein the end condition is reached when an error rate resulting from the testing is below or above a threshold error rate.

15. The method of claim 10, wherein the receiver comprises an equalizer and wherein at least some of the configurable calibration parameters comprises equalization parameters.

16. The method of claim 15, wherein the equalizer comprises a multi-tap filter and the at least some of the configurable calibration parameters comprise weighting values for the taps of the multi-tap filter.

17. A method comprising:
determining, by a control circuit, for each configurable calibration parameter of a plurality of configurable calibration parameters for a receiver for processing a received signal from an interconnect coupled to the receiver, a range of valid values for the configurable calibration parameter;
for each configurable calibration parameter:
  sweeping the configurable calibration parameter across a subset of values from the range of valid values for the configurable calibration parameter; and
  testing the received signal from the interconnect for each value in the subset of values and storing a result of the testing for the value; and
determining a set of calibrated values for the configurable calibration parameters based on the results of the testing;
wherein sweeping the configurable calibration parameter across the subset of values comprises:
  initializing the configurable calibration parameter to a first value and then increasing the configurable calibration parameter until an end condition is reached based on the results of the testing; and
  initializing the configurable calibration parameter to a second value greater than the first value and then decreasing the configurable calibration parameter until the end condition is reached.

18. A method comprising:
determining, by a control circuit, for each configurable calibration parameter of a plurality of configurable calibration parameters for a receiver for processing a received signal from an interconnect coupled to the receiver, a range of valid values for the configurable calibration parameter;
for each configurable calibration parameter:
  sweeping the configurable calibration parameter across a subset of values from the range of valid values for the configurable calibration parameter; and
  testing the received signal from the interconnect for each value in the subset of values and storing a result of the testing for the value; and
determining a set of calibrated values for the configurable calibration parameters based on the results of the testing;
wherein determining the set of calibrated values for the configurable calibration parameters based on the results of the testing comprises determining a centroid of a multi-dimensional array formed by the results of the testing.

19. One or more non-transitory computer readable mediums storing instructions for a control circuit that, when executed by the control circuit, cause the control circuit to perform operations comprising:

determining, for each configurable calibration parameter of a plurality of configurable calibration parameters for a receiver for processing a received signal from an interconnect coupled to the receiver, a range of valid values for the configurable calibration parameter;

for each configurable calibration parameter:
sweeping the configurable calibration parameter across a subset of values from the range of valid values for the configurable calibration parameter, wherein sweeping the configurable calibration parameter comprises holding each of the configurable calibration parameters, other than the configurable calibration parameter, constant while sweeping the configurable calibration parameter; and
testing the received signal from the interconnect for each value in the subset of values and storing a result of the testing for the value; and determining a set of calibrated values for the configurable calibration parameters based on the results of the testing.

* * * * *